(12) United States Patent
Schulze et al.

(10) Patent No.: US 7,838,970 B2
(45) Date of Patent: Nov. 23, 2010

(54) SEMICONDUCTOR COMPONENT WITH HIGH CONCENTRATION DOPED ZONE EMBEDDED IN EMITTER REGION

(75) Inventors: Hans-Joachim Schulze, Ottobrunn (DE); Franz Josef Niedernostheide, Muenster (DE); Gerald Soelkner, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/050,649

(22) Filed: Feb. 2, 2005

(65) Prior Publication Data

US 2005/0258455 A1 Nov. 24, 2005

(30) Foreign Application Priority Data

Feb. 2, 2004 (DE) .................. 10 2004 005 084

(51) Int. Cl.
*H01L 21/74* (2006.01)
(52) U.S. Cl. ........................ 257/657; 257/131
(58) Field of Classification Search ......... 257/128–131, 257/657
See application file for complete search history.

(56) References Cited

U.S. PATENT DOCUMENTS

| | | | |
|---|---|---|---|
| 4,587,547 A | 5/1986 | Amemiya et al. | |
| 5,565,694 A * | 10/1996 | Huang et al. | 257/97 |
| 5,569,941 A * | 10/1996 | Takahashi | 257/133 |
| 5,656,514 A | 8/1997 | Ahlgren et al. | |
| 2002/0130331 A1* | 9/2002 | Nemoto et al. | 257/109 |
| 2002/0175351 A1 | 11/2002 | Baliga | |
| 2006/0246650 A1* | 11/2006 | Williams et al. | 438/212 |

FOREIGN PATENT DOCUMENTS

| | | |
|---|---|---|
| EP | 0 345 435 A2 | 12/1989 |
| EP | 0 779 662 A2 | 6/1997 |
| JP | 62141782 A | 6/1987 |
| JP | 2001135830 A | 5/2001 |

OTHER PUBLICATIONS

Egawa. H., "Avalanche Characteristics and Failure Mechanism of High Voltage Diodes", IEEE Transactions on Electron Devices, vol. 13, 1996, pp. 754-758, (5 pages).

* cited by examiner

*Primary Examiner*—Wael M Fahmy
*Assistant Examiner*—Abul Kalam
(74) *Attorney, Agent, or Firm*—Maginot, Moore & Beck

(57) ABSTRACT

A semiconductor component has a first and a second contact-making region, and a semiconductor volume arranged between the first and the second contact-making region. Within the semiconductor volume, it is possible to generate a current flow that runs from the first contact-making region to the second contact-making region, or vice versa. The semiconductor volume and/or the contact-making regions are configured in such a way that the local flow cross-section of a locally elevated current flow, which is caused by current splitting, is enlarged at least in partial regions of the semiconductor volume.

8 Claims, 3 Drawing Sheets

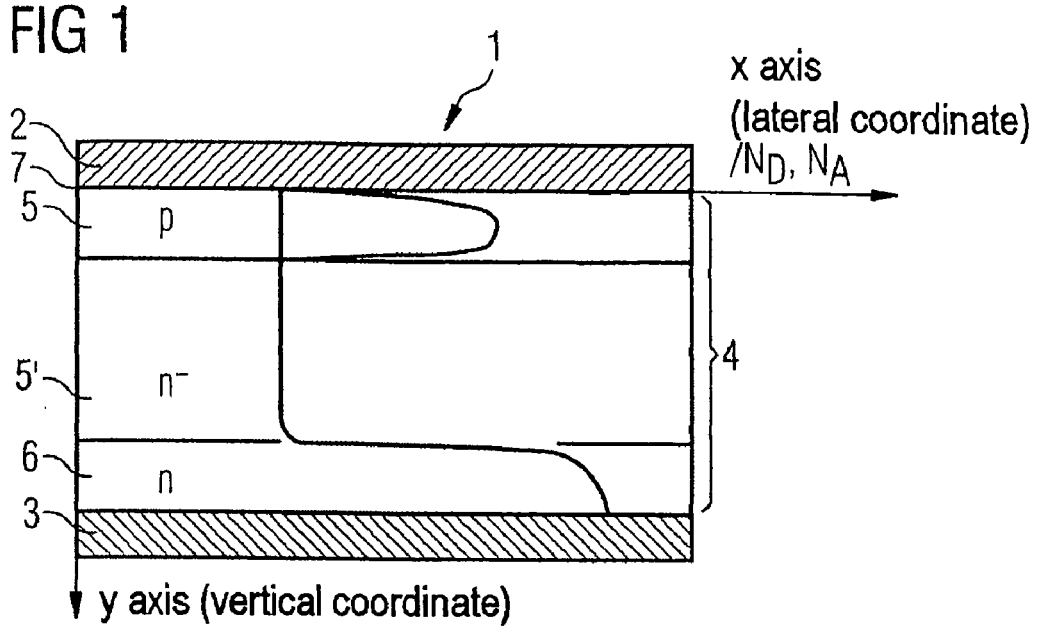
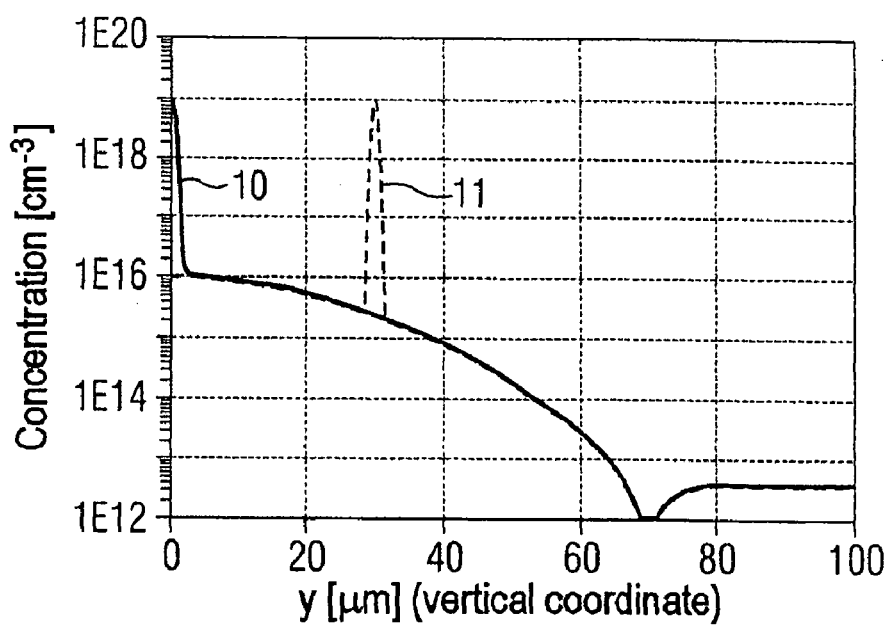
— boron emitter near the surface 1e19cm⁻³
--- buried boron emitter 1e19cm⁻³

SEMICONDUCTOR COMPONENT WITH HIGH CONCENTRATION DOPED ZONE EMBEDDED IN EMITTER REGION

FIELD OF THE INVENTION

The invention relates to a semiconductor component.

BACKGROUND AND SUMMARY

Inhomogeneous turn-off processes may lead to a local elevation (splitting) of the current density within a semiconductor component. If the current density exceeds a specific threshold value, the semiconductor component is destroyed. Excessive increases in current density may also be based on other causes, for example on a local elevation of the concentration of free charge carriers, which may be caused e.g. by cosmic radiation.

The object on which the invention is based is to specify a semiconductor component in which, even in the case of inhomogeneous turn-off processes or on account of other events, a local excessive increase in the current density within the semiconductor component can be counteracted and destruction of the semiconductor component can thus be prevented.

This object is achieved by a semiconductor component in accordance with embodiments of the invention.

The semiconductor component according to embodiments of the invention has a first and a second contact-making region, and a semiconductor volume arranged between the first and the second contact-making region. Within the semiconductor volume, it is possible to generate a current flow that runs from the first contact-making region to the second contact-making region, or vice versa. The semiconductor volume and/or the contact-making regions are configured according to the invention in such a way that the local flow cross-section of a locally elevated current flow, which is caused by current splitting, is enlarged at least in partial regions of the semiconductor volume.

According to the above described embodiments of the invention, then, the flow cross-section of the elevated current flow, upon occurrence of splitting, is widened, preventively, in order that only small excessive increases in the current density can occur in the case of an inhomogeneous turn-off process, by way of example, within a specific region of the semiconductor volume (on account of the enlarged flow cross-section of the current flow, within a certain region of the semiconductor volume, only a reduced proportion of charge carriers that form the current flow is available for a "potential" local excessive increase in the current density).

The flow cross-section of the current flow is enlarged according to embodiments of the invention by virtue of the fact that the current flow is impeded in the main current flow direction, and/or the current flow is promoted in a direction that is different from the main current flow direction. The direction in which the current flow is promoted is preferably a direction that runs perpendicularly to the main current flow direction. Depending on the application, however, any other direction that does not correspond to the main current flow direction is also taken into consideration.

By way of example, doped zones may be formed in the semiconductor volume in such a way that the ratio of the conductivity in one or more directions that are different from the main current flow direction to the conductivity of the main current flow direction is increased. For this purpose, the doped zones may have conventional doping profiles or retrograde profiles/depletion profiles. The semiconductor component may have, by way of example, a vertical or lateral construction or a combination of the two. In a vertical semiconductor component, the semiconductor volume and/or the contact-making regions are configured in such a way that the current flow, upon occurrence of splitting, is impeded at least locally in the vertical direction (main current flow direction) and/or is promoted in at least one lateral direction. Analogously, in the case of a lateral semiconductor component, the semiconductor volume and/or the contact-making regions are configured in such a way that the current flow, upon occurrence of splitting, is impeded at least locally in at least one first lateral direction (main current flow direction) and/or is promoted in the vertical direction or in a second lateral direction.

In order, for example, to promote the current flow in a direction perpendicular to the main current flow direction, doped zones may be provided in the semiconductor volume, in which case, given e.g. a vertical main current flow direction, the ratio of lateral to vertical conductivity of the doped zones (i.e. the ratio of the conductivity in one or more planes perpendicular to the main current flow direction to the conductivity in the main current flow direction) is designed to be as high as possible. The doped zones have the effect that charge carriers are transported into "remote" regions of the semiconductor volume into which, under "normal circumstances", i.e. without the doped zones, they would not pass or would pass only in a low concentration. The dimensions of the doped zones are thus established in such a way that the latter extend into, adjoin and/or extend as closely as possible to all regions of the semiconductor volume that are intended to be included by the current flow.

The doped zones are situated for example in emitter zones, base zones or field stop zones of the semiconductor component, but may, in principle be introduced at an arbitrary position within the semiconductor volume. Preferably, the doped zones are provided in and/or near the regions of the semiconductor volume in which the highest field strengths occur. These are the emitter zones, by way of example, in the case of diodes. If the doped zones are provided in the emitter zones, these should advantageously not be provided at the edge of the emitter zones, but rather be buried within the emitter zones (in other words not at or closely below the surface of the emitter zones). This makes it possible to achieve an improved expansion of the local flow cross-section upon occurrence of splitting.

In order to promote the current flow in a specific direction, it is also possible, as an alternative to the provision of a doped zone, for the contact resistance between the semiconductor volume and the first or second contact region to be elevated in such a way that, on the one hand, proper operation of the semiconductor component is ensured and, on the other hand, the flow cross-section of the current flow that enters into the contact-making regions/emerges from the contact-making regions is expanded at the junction between semiconductor volume and contact regions. The contact-making resistance may in this case be brought about both by the choice of a specific metallization material and by a reduction of the dopant concentration in that part of the semiconductor volume which adjoins the contact-making region.

If the contact-making resistance between the semiconductor volume and the contact-making regions is very high, at the junction between the first and/or second contact-making region and the semiconductor volume, low-impedance channels should be formed in the semiconductor volume, which channels are distributed as homogeneously as possible over the junction. Such a provision of low-impedance channels may also be used beneficially in the case of a low contact-making resistance.

A further possibility for expanding the local flow cross-section in the boundary region between contact-making regions and semiconductor volume consists in the contact-making regions not being applied over the whole area, but rather to corresponding surfaces of the semiconductor volume in a patterned manner in the form of individual contact-making zones. In this case, the contact-making zones should be distributed as homogeneously as possible over the surface of the semiconductor volume.

The principle according to the invention may be used in arbitrary semiconductor components, for example in diodes, thyristors, IGBTs, etc.

BRIEF DESCRIPTION OF THE DRAWINGS

The invention is explained in more detail below in exemplary embodiment with reference to the figures, in which:

FIG. 1 shows a cross-section and a doping profile of a preferred embodiment of a semiconductor diode according to the invention.

FIG. 2 shows a doping profile of a further preferred embodiment of a semiconductor diode according to the invention.

DETAILED DESCRIPTION

Figure 3:
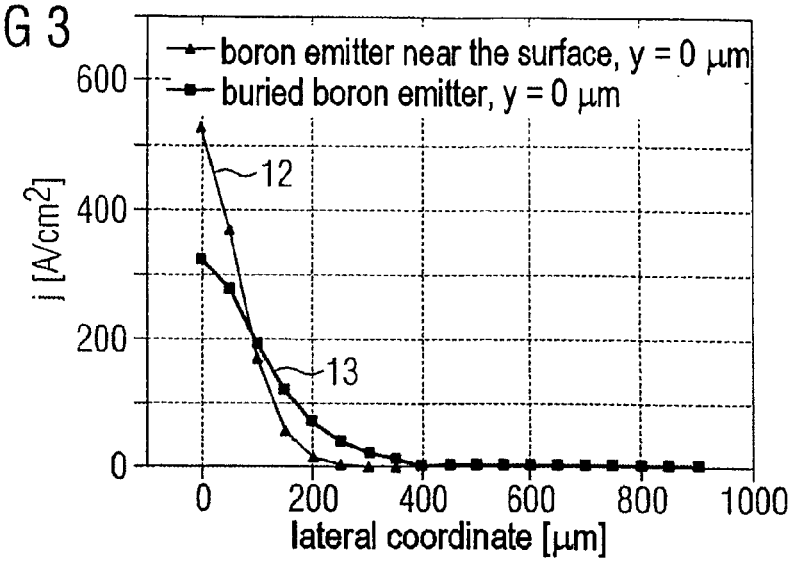
FIG. 3 shows profiles of current density distributions during the turn-off behavior for a conventional semiconductor diode and a semiconductor diode according to the invention.

In the figures, identical or mutually corresponding components or component groups are identified by the same reference numerals. Moreover, all the embodiments described in the text of the application can be doped inversely, i.e. n-type and p-type regions can be interchanged with one another.

FIG. 1 shows a first embodiment of a semiconductor component according to the invention using the example of a diode having a high blocking capability. A diode 1 has a first contact-making region 2 and a second contact-making region 3. A semiconductor volume 4 is arranged between the first contact-making region 2 and the second contact-making region 3. The semiconductor volume 4 has a p-type emitter 5, an n-type base 5' and an n-type emitter 6.

The semiconductor diode 1 shown in FIG. 1 has a vertical construction, that is to say that the current flow between the first and the second contact-making region 2, 3 moves in the vertical direction.

The p-type emitter 5 has a retrograde profile in order to improve the ratio of the transverse conductivity (lateral direction) to the vertical conductivity in the p-type emitter 5. In this context, "Retrograde" means that the doping maximum lies in the depth of corresponding semiconductor layers and not at the surfaces thereof—as is otherwise customary. The retrograde profile is indicated in FIG. 1 by the dopant concentration profile (donor concentration $N_D$, acceptor concentration $N_A$) depicted.

The lateral expansion of the current flow upon occurrence of current splitting may accordingly be brought about by shifting the maximum of the conductivity of one or more current-carrying layers (the p-type emitter 5 is modified correspondingly in the case of the semiconductor diode 1 shown in FIG. 1) into the "wafer depth", in FIGS. 1 and 2 the axis designated by y representing the depth axis (vertical coordinate) and the axis designated by x representing a first lateral direction (lateral coordinate). The ratio of the transverse conductivity to the vertical conductivity is thus raised. This can be realized for example, as is illustrated in FIG. 1, by so-called "depletion profiles" which can be produced for example by aluminum vacuum deposition, in combination with a subsequent drive-in step.

As an alternative to this, a depletion profile may be brought about with the aid of a boron deep implantation in combination with a subsequent drive-in step, by means of epitaxy processes, by application of a wafer bonding method or else by means of a boron drive-in step, which uses the so-called "pile down" effect in a targeted manner. All of the alternatives described can contribute to the fact that the ratio of lateral conductivity in a specific depth of the semiconductor diode 1 to the vertical conductivity (lateral conductivity/vertical conductivity) is as high as possible, and, consequently, the direct current flow upon occurrence of splitting toward a surface 7 of the semiconductor volume 4/away from the surface 7 of the semiconductor volume 4 is reduced.

"Depletion profile" is to be understood as the decrease in the dopant concentration in the direction of the surface of the corresponding semiconductor layer, as is shown in the p-type emitter 5 in FIG. 1, for example.

The n-type emitter 6 shown in FIG. 1 does not have a retrograde doping profile; the doping maximum here lies directly at the surface. It goes without saying that within the semiconductor volume it is also possible to provide a plurality of layers having a retrograde profile, that is to say that the n-type emitter 6 could likewise have a retrograde doping profile.

FIG. 2 shows two dopant concentration profiles, the concentration profile identified by reference numeral 10 representing a p-type emitter of a conventional diode, and a concentration profile identified by reference numeral 11 relating to a p-type emitter of a semiconductor component according to the invention, for example the p-type emitter 5 shown in FIG. 1. The p-type emitter of the conventional semiconductor component (concentration profile 10) comprises a superposition of a 70 μm deep p-conducting region having an edge concentration of approximately $10^{16}$ $cm^{-3}$ and a shallow, heavily doped boron emitter near the surface having an edge concentration of approximately $10^{19}$ $cm^{-3}$. The p-type emitter of the semiconductor component according to the invention (concentration profile 11) comprises a superposition of a likewise 70 μm deep p-conducting region, the heavily doped boron emitter in this case being "buried" at a depth (distance from the surface of the semiconductor volume) of y=30 μm, which brings about a significantly better transverse conductivity in the p-type emitter. Forward voltage and reverse current maximum of the two semiconductor diodes are approximately identical. If the diodes are turned off very rapidly from the on state, then current filaments form on account of the so-called dynamic avalanche effect.

FIG. 3 compares the current density distributions in a cross-section directly at the anode contact (y=0 μm) for the conventional diode and the diode according to the invention. The current density distributions were recorded in each case at the instant directly after filament production. In this case, the current density distribution profile identified by reference numeral 12 corresponds to the concentration profile identified by reference numeral 10 from FIG. 2, and the current density distribution profile identified by reference numeral 13 corresponds to the concentration profile identified by reference numeral 11 in FIG. 2.

FIG. 3 clearly shows that the current density distribution for the buried highly doped boron emitter in the semiconductor diode according to the invention is significantly wider and the maximum current density at the center of the current density filament is reduced by more than 30%, so that the risk of irreversible destruction of the diode can be significantly reduced. A further improvement can be achieved by means of a corresponding elevation of the transverse conductivity in the n-type emitter 6 of the semiconductor diode 1.

Retrograde doping profiles or buried, heavily doped doping layers with improved transverse conductivity can be used not only in diodes but also in other high-power components, such as e.g. thyristors or IGBTs. Depending on the design of the corresponding component, it may also be advantageous in this case not only to provide the outer emitter layers with such profiles, but also to elevate the transverse conductivity of the base zones or of field stop layers that are possibly present in a suitable depth.

A further measure for inhibiting the current flow in the vertical direction upon occurrence of splitting consists—as already mentioned—in elevating in a defined manner the contact resistance between the semiconductor surface and the metallization applied thereto, which is controlled by the selection of a suitable metallization material, on the one hand, and by the magnitude of the edge concentration of the doping layer adjoining the surface of the semiconductor volume, on the other hand. This may be driven so far that a Schottky contact forms at the surface of the semiconductor volume; in this case, low-impedance channels should be created at specific intervals in the lateral direction (in the case of a vertical semiconductor component) in order that the forward voltage of the semiconductor component does not rise to an excessively great extent. The low-impedance channels may be produced for example by means of a masked implantation with a subsequent drive-in step.

Figure 4:
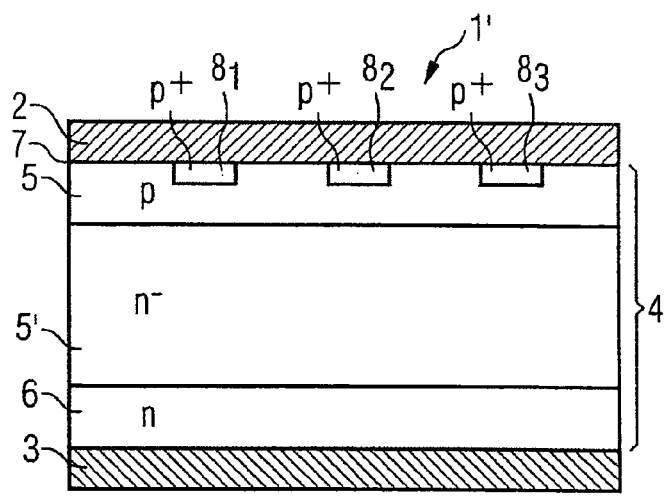
FIG. 4 shows a cross-sectional illustration of a further embodiment of a semiconductor diode according to the invention.

FIG. 4 shows a semiconductor component according to the invention with low-impedance channels once again using the example of a semiconductor diode. The construction of the embodiment 1' of a diode as shown in FIG. 4 essentially corresponds to that from FIG. 1, but with the difference that low-impedance channels $8_1$ to $8_3$ are provided instead of the retrograde doping profiles or preferably in combination with the retrograde doping profiles in the p-type emitter 5, which channels are $p^+$-doped and arranged in a manner adjoining the junction between the semiconductor volume 4 and the first contact-making region 2 at regular intervals.

Figure 5:
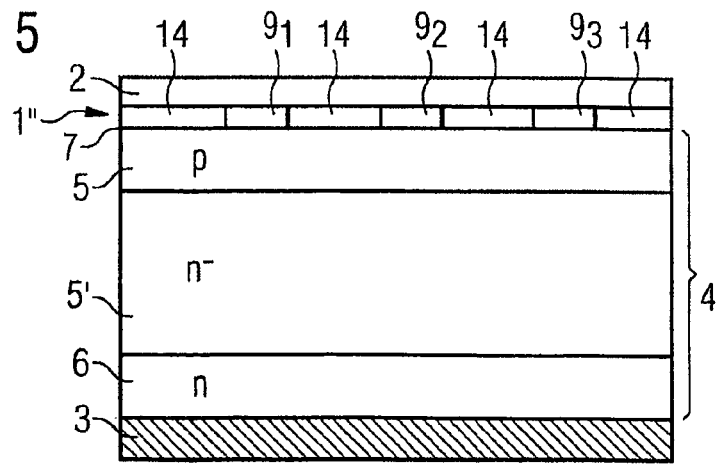
FIG. 5 shows a cross-sectional illustration of yet another embodiment of a semiconductor diode according to the invention.

As an alternative to this, it is possible, as becomes clear in the embodiment 1" shown in FIG. 5, for the first contact-making region 2 to be designed in such a way that it makes contact with the semiconductor volume 4 only at specific locations via corresponding contact holes $9_1$ to $9_3$. An insulator 14 is provided between the contact holes $9_1$ to $9_3$, and electrically insulates the first contact-making region 2 from the semiconductor volume 4 across specific regions. Accordingly, contact is not made over the whole area, but rather only at specific points, in which case the contact holes $9_1$ to $9_3$, for obtaining a homogeneous current density, should be distributed as uniformly as possible over the surface 7 of the semiconductor volume 4.

In the embodiments shown in FIGS. 4 and 5, the semiconductor layers 5, 5' and 6 may have a "normal" (homogeneous) or retrograde doping profile.

In order to produce the patterned contact-making region 2 shown in FIG. 5, it might be possible, prior to the application of the metallization, by way of example, for an oxide layer to be deposited on the semiconductor surface 7, which is patterned in such a way that the metal has contact with the semiconductor surface 7 only via the contact holes $9_1$ to $9_3$.

It goes without saying that all of the measures described can be applied in the same way to the second contact-making region 3.

The measures described above have already made it possible to produce semiconductor components (diodes) resistant to cosmic radiation and having an edge concentration low enough to result in a high-impedance contact between the semiconductor volume 4 and the first contact-making region 2. (Low-impedance channels were in this case realized in the form of aluminum spikes distributed over the surface 7 of the semiconductor volume 4.) In these diodes, it was possible to improve a radiation-dictated failure rate by a factor of 50. Likewise, the resistance to cosmic radiation was able to be significantly improved by local removal of metallization regions.

In accordance with the invention, accordingly, the current flow in a filament below the wafer surface of a semiconductor component below which the maximum electric field occurs in reverse loading is widened in a targeted manner, thereby reducing the current density in the filament in the regions having a high field strength. In this case, the current flow in the filament is intended to be effected not only vertically in the direction of the wafer surface, but also in the lateral direction in the region below the wafer surface, in which case the current-carrying volume should be as large as possible in this region.

In accordance with the invention, accordingly, the maximum current density in filaments is lowered by widening the current filament in a targeted manner. In the case of diodes, the measures according to the invention relate principally to the p-type emitter layer, but corresponding modifications can also be applied to the n-type emitter (particularly in the case where the so-called Egawa field occurs (in this respect see H. Egawa, IEEE Transactions on Electron Devices, Vol. 13, page 754 et seq. (1996)).

Figure 6A:
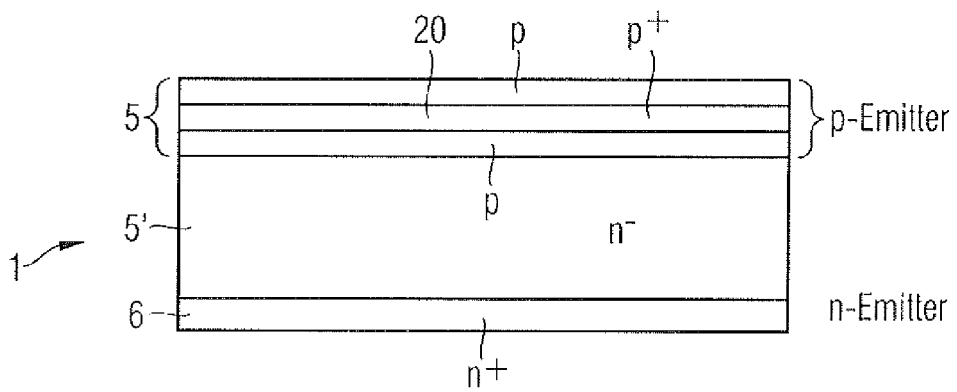
FIGS. 6a, 6b, 6c show cross-sectional illustrations of yet other embodiments of a semiconductor diode according to the invention.
Figure 6B:
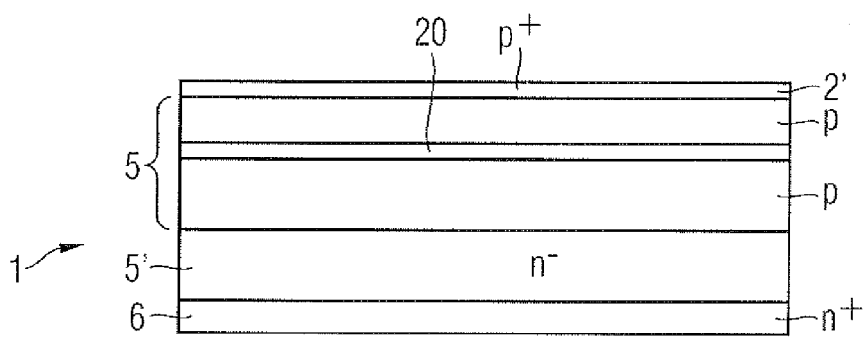
Figure 6C:
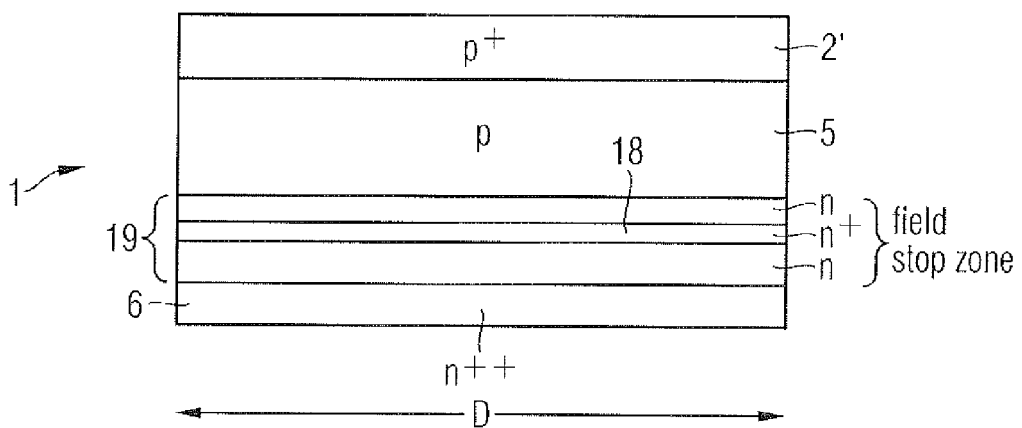

FIGS. 6A to 6C show cross-sections of semiconductor diodes in accordance with yet further embodiments of the invention. In FIG. 6A, a highly doped p+ type zone 20 is embedded in a p type conducting emitter 5 which is provided on an n– type conducting base and an n+ type conducting emitter 6. FIG. 6B shows additionally a p+ type conducting contact layer 2' which is provided on the p type conducting emitter 5.

Of course, in FIGS. 6A and 6B as well as FIG. 6C, the respective conductivity types can also be reversed, i.e., the n type conductivity can be replaced by the p type conductivity, if the n type conductivity is also used in place of the p type conductivity.

FIG. 6C shows a further embodiment wherein an n type conducting field stop zone 19 includes an n+ type conducting layer 18.

In the above described embodiments of FIGS. 6A, 6B and 6C, a highly doped zone 20 (FIGS. 6A and 6B) or 18 (FIG. 6C) is embedded in a region 5 (FIGS. 6A and 6B) or 19 (FIG. 6C) of the same conductivity type buy having a lower doping concentration.

The lateral dimension D of the highly doped zones 18, 20 amounts to at least 100 μm (see also FIG. 3), preferably to at least 200 μm, more preferably to at least 1 mm, and most preferably to 0.5 cm or even more, i.e. to a typical chip size. Moreover, the zones 18, 20 can have a circular or rectangular configuration.

LIST OF REFERENCE SYMBOLS

1, 1', 1" Semiconductor diode
2 First contact region
3 Second contact region
4 Semiconductor volume
5 p-type emitter
5' $n^-$-type base
6 n-type emitter
7 Surface of the semiconductor volume
8$_1$ to 8$_3$ First to third low-impedance channel
9$_1$ to 9$_3$ First to third contact hole
10 Concentration profile
11 Concentration profile
12 Current density distribution profile
13 Current density distribution profile
14 Insulator

The invention claimed is:

1. A semiconductor component comprising:
contact-making regions including first and second contact-making regions;
a semiconductor volume disposed between the first and the second contact-making regions, the semiconductor volume comprising first and second emitter zones, a base zones and a field stop zones, and configured to provide a current flow between the first contact-making region and the second contact-making region, the semiconductor volume including a doped zone, said doped zone being embedded in said first emitter zone, so as to adjoin a first region and a second region of the first emitter zone, the first and second regions of the first emitter zone being of the same dopant type as said doped zone and the doping concentration of said doped zone being higher than the doping concentrations of the first and second regions of the first emitter zone, the first emitter zone being provided on the base zone and on the second emitter zone the base zone and the second emitter zone being of a different dopant type than said doped zone, the doped zone configured such that a ratio of a conductivity in one or more directions which are different from a main current flow direction to a conductivity of the main current flow direction is increased, and such that a local flow cross-section of a locally elevated current flow caused by current splitting is increased at least in partial regions of the semiconductor volume, and said doped zone extending to all regions of the semiconductor volume that are intended to be included by the current flow such that the current flow reaches regions of the semiconductor volume which it would not reach or would reach only in a low concentration without the provision of the doped zone.

2. The semiconductor component as claimed in claim 1, wherein the doped zones have retrograde profiles.

3. The semiconductor component as claimed in claim 1, wherein the doped zones have depletion profiles.

4. The semiconductor component as claimed in claim 1, wherein the semiconductor component has a vertical construction, and wherein the doped zone is configured such that the current flow, upon occurrence of current splitting, is at least one of impeded at least locally in the vertical direction or promoted in at least one lateral direction.

5. The semiconductor component as claimed in claim 1, wherein the semiconductor component has a lateral construction, and wherein the doped zones are configured such that the current flow, upon occurrence of current splitting, is at least one of impeded at least locally in at least one first lateral direction or promoted in at least one of the vertical direction or a second lateral direction.

6. The semiconductor component as claimed in claim 1, wherein the doped zone is configured such that a ratio of a conductivity in one or more planes perpendicular to the main current flow direction to the conductivity in the main current flow direction is increased.

7. The semiconductor component as claimed in claim 1, wherein the doped zone is situated proximate to or at least partly within one or more regions of the semiconductor volume in which highest field strengths occur.

8. The semiconductor component as claimed in claim 4, wherein the lateral dimensions of the doped zone is approximately 100 μm.

* * * * *